United States Patent
Aniya et al.

(10) Patent No.: US 9,424,873 B2
(45) Date of Patent: Aug. 23, 2016

(54) METHOD OF MANUFACTURING MAGNETIC RECORDING MEDIUM, AND MAGNETIC RECORDING MEDIUM

(75) Inventors: Masanori Aniya, Tokyo (JP); Yoshiaki Sonobe, Tokyo (JP)

(73) Assignee: WD Media (Singapore) Pte. Ltd, Singapore (SG)

( * ) Notice: Subject to any disclaimer, the term of this patent is extended or adjusted under 35 U.S.C. 154(b) by 461 days.

(21) Appl. No.: 13/202,255

(22) PCT Filed: Feb. 19, 2010

(86) PCT No.: PCT/JP2010/052567
§ 371 (c)(1),
(2), (4) Date: Aug. 18, 2011

(87) PCT Pub. No.: WO2010/095725
PCT Pub. Date: Aug. 26, 2010

(65) Prior Publication Data
US 2011/0299194 A1    Dec. 8, 2011

(30) Foreign Application Priority Data

Feb. 19, 2009  (JP) ................................. 2009-036233

(51) Int. Cl.
*C23C 14/48*    (2006.01)
*G11B 5/855*    (2006.01)
(Continued)

(52) U.S. Cl.
CPC .............. *G11B 5/855* (2013.01); *C23C 14/042* (2013.01); *C23C 14/048* (2013.01); *C23C 14/48* (2013.01); *G11B 5/66* (2013.01); *H01J 37/3171* (2013.01); *H01J 2237/3171* (2013.01)

(58) Field of Classification Search
CPC ............ G11B 5/82; G11B 5/84; C23C 14/04; C23C 14/042; C23C 14/048; C23C 14/48; H01J 37/3171; H01J 2237/3171; H01J 2237/31711

See application file for complete search history.

(56) References Cited

U.S. PATENT DOCUMENTS 7,833,639 B2 * 11/2010 Sonobe et al. ................. 428/826
8,076,013 B2 * 12/2011 Sonobe et al. ................. 428/827
(Continued)

FOREIGN PATENT DOCUMENTS

JP      2000-298825         10/2000
JP      2008-052860 A *      3/2008    ............... G11B 5/84
(Continued)

OTHER PUBLICATIONS

Machine translation of JP 2008-077788 A, published Apr. 2008, by Akira et al.*

(Continued)

*Primary Examiner* — Marianne L Padgett

(57) ABSTRACT

A method of manufacturing a perpendicular magnetic recording medium 100 that includes forming a magnetic recording layer 122 on a disk base 110, then forming a resist layer 130 on the magnetic recording layer, and a patterning step of processing the resist layer so as to vary the thickness of the resist layer partially, thereby forming a predetermined pattern having a recessed part and a projected part. Finally, the method includes implanting ions into a plurality of layers including the magnetic recording layer with the resist layer interposed. At the ion implanting step, (1) one or more of said plurality of layers to be implanted with ions is determined by selectively applying an energy amount to implant ions, and (2) a total amount of ions to be implanted into each of said one or more of said plurality of layers is determined by selectively applying said energy amount for a respective time period for said one or more of said plurality of layers.

10 Claims, 8 Drawing Sheets

(51) Int. Cl.
*H01J 37/317* (2006.01)
*C23C 14/04* (2006.01)
*G11B 5/66* (2006.01)
*C23C 14/58* (2006.01)

(56) References Cited

U.S. PATENT DOCUMENTS

| | | | |
|---|---|---|---|
| 8,257,845 B2* | 9/2012 | Hinoue et al. | 428/828.1 |
| 8,605,388 B2* | 12/2013 | Yasumori et al. | 360/135 |
| 8,795,790 B2* | 8/2014 | Sonobe et al. | 427/526 |
| 9,005,699 B2* | 4/2015 | Sonobe et al. | 427/130 |
| 2008/0090104 A1* | 4/2008 | Sonobe et al. | 428/800 |
| 2009/0123660 A1* | 5/2009 | Inaba | G11B 5/855 |
| | | | 427/535 |
| 2009/0199768 A1* | 8/2009 | Verhaverbeke et al. | 118/728 |
| 2009/0237838 A1* | 9/2009 | Fukushima et al. | 360/110 |
| 2009/0323219 A1* | 12/2009 | Fukushima et al. | 360/122 |
| 2010/0096256 A1* | 4/2010 | Nalamasu et al. | 204/192.34 |
| 2010/0098873 A1* | 4/2010 | Verhaverbeke et al. | 427/526 |
| 2010/0221583 A1* | 9/2010 | Foad | G11B 5/855 |
| | | | 428/846 |
| 2010/0321826 A1* | 12/2010 | Yasumori et al. | 360/135 |
| 2011/0101247 A1* | 5/2011 | Hilkene | B82Y 10/00 |
| | | | 250/492.3 |
| 2011/0104393 A1* | 5/2011 | Hilkene | G11B 5/855 |
| | | | 427/526 |
| 2012/0170152 A1* | 7/2012 | Sonobe et al. | 360/135 |

FOREIGN PATENT DOCUMENTS

| | | | | |
|---|---|---|---|---|
| JP | 2008-077756 | | 4/2008 | |
| JP | 2008-077756 A | * | 4/2008 | G11B 5/84 |
| JP | 2008-077788 A | * | 4/2008 | |
| WO | 2008-099859 | | 8/2008 | |

OTHER PUBLICATIONS

PCT International Search Report for related application PCT/JP2010/052567, filed Feb. 19, 2010, pp. 6.
abstract of JP 2008-077788; published Apr. 3, 2008.

* cited by examiner

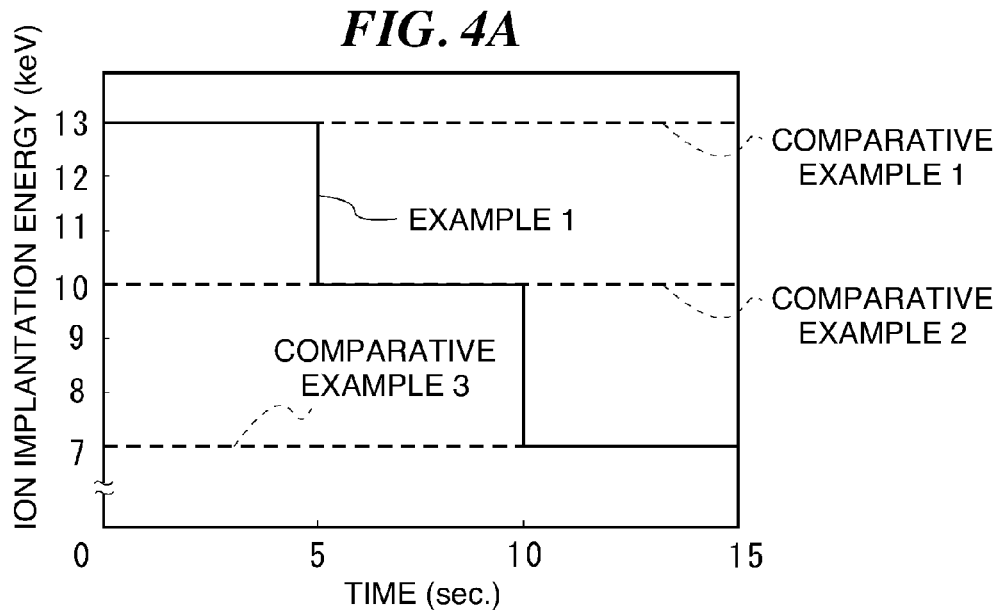
FIG. 4A
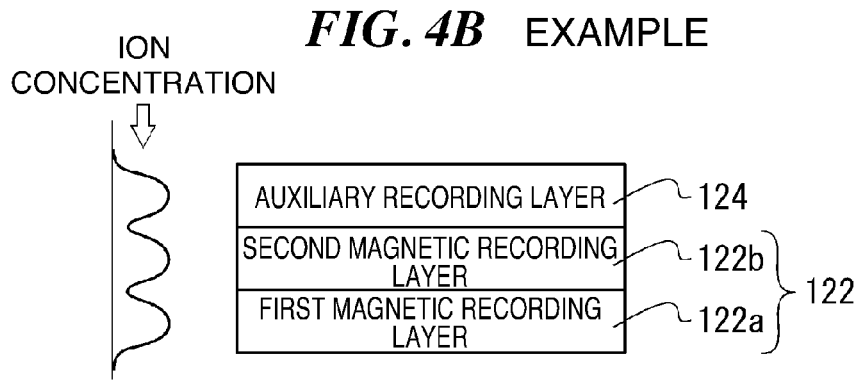
FIG. 4B   EXAMPLE
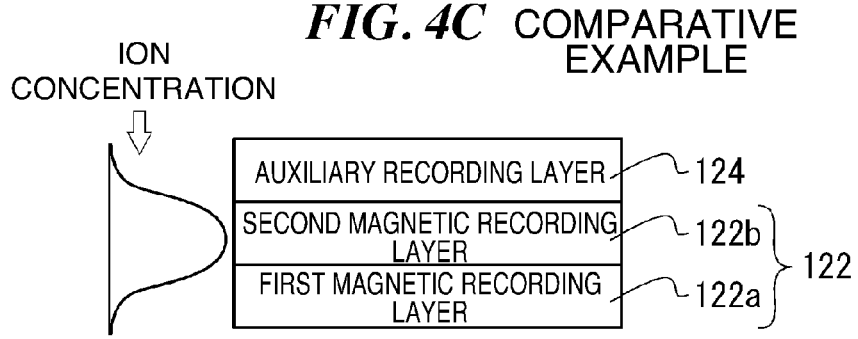
FIG. 4C   COMPARATIVE EXAMPLE

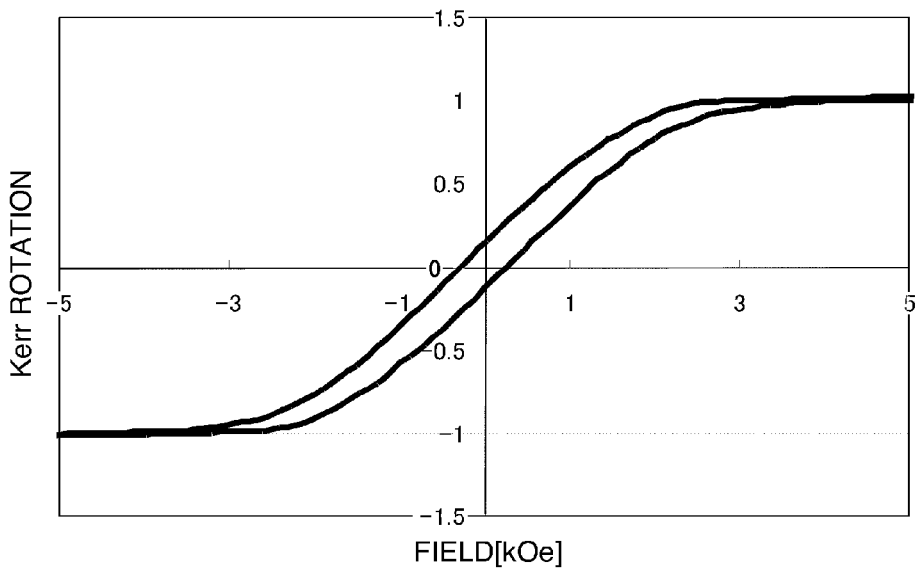
FIG. 5A EXAMPLE 1
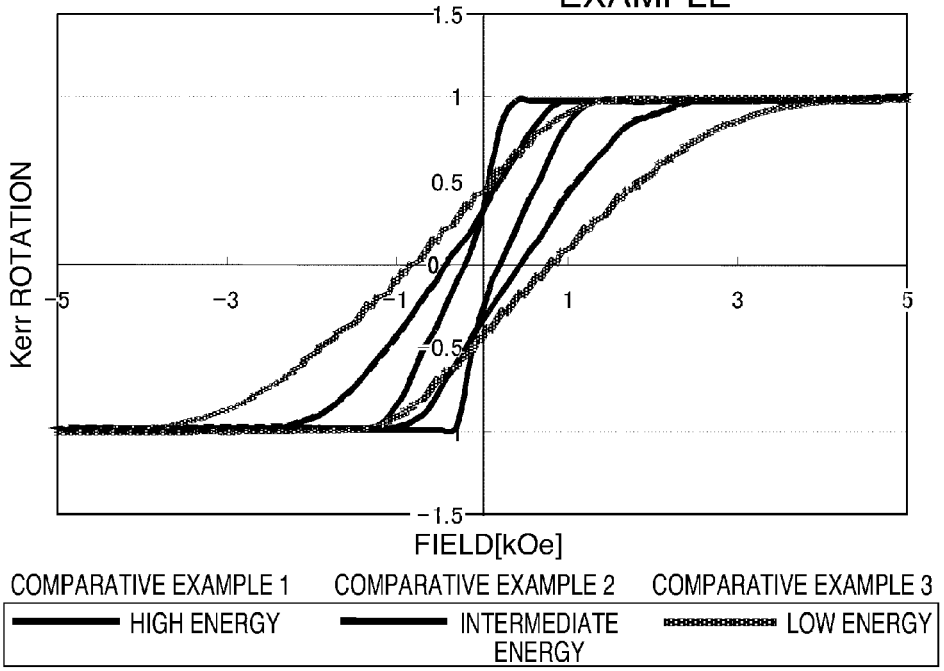
FIG. 5B COMPARATIVE EXAMPLE

METHOD OF MANUFACTURING MAGNETIC RECORDING MEDIUM, AND MAGNETIC RECORDING MEDIUM

TECHNICAL FIELD

The present invention relates to a method of manufacturing a magnetic recording medium installed in an HDD (Hard Disk Drive) or the like and to a magnetic recording medium.

BACKGROUND OF THE INVENTION

With increase in capacity of information processing in recent years, various information recording technologies have been developed. In particular, the surface recording density of an HDD using a magnetic recording technology is continuously increasing at an annual rate of approximately 100%. Recently, an information recording capacity exceeding 200 gigabytes/platter with a 2.5-inch diameter of a magnetic disk for use in an HDD or the like has been demanded, and in order to satisfy such a demand, an information recording density exceeding 400 gigabits/square inch is required to be realized.

In order to achieve high recording density in a magnetic disk for use in an HDD or the like, a magnetic disk of a perpendicular magnetic recording type (a perpendicular magnetic recording disk) has been suggested in recent years. In an in-plane magnetic recording type, an easy axis of magnetization of a magnetic recording layer is oriented in a planar direction of a base surface, but in the perpendicular magnetic recording type, the easy axis of magnetization is adjusted so as to be oriented in a perpendicular direction with respect to the base surface. Compared with the in-plane magnetic recording type, the perpendicular magnetic recording type can suppress a thermal fluctuation phenomenon more at a high-density recording time, and therefore is suitable for increasing recording density.

Furthermore, as technologies that improve recording density and resistance to thermal fluctuation, suggested are magnetic recording media called a discrete track medium preventing interference of an adjacent recording track by patterning a non-magnetic track in parallel between magnetic tracks for recording, and called a bit pattern medium with arbitrary patterns artificially regularly arranged.

For patterned media, such as a discrete track medium and a bit pattern medium, suggested are a technology of forming a magnetic pattern composed of magnetic recording parts and non-recording parts by forming a magnetic recording layer on a non-magnetic base and thereafter implanting ions partially to perform demagnetization or amorphization of ion-implanted parts on the magnetic recording layer, which results in the demagnetized or amorphized parts on the magnetic recording layer serving as the non-recording parts and the magnetic recording parts magnetically separated by the non-recording parts, and a technology of forming a magnetic pattern in which a magnetic recording layer is physically separated by asperites by forming the magnetic recording layer on a non-magnetic base and thereafter milling the magnetic recording layer partially to form the asperities.

Specifically, first, a resist film is formed on a magnetic recording layer, and a stamper having a desired asperity pattern formed thereon is imprinted on the resist film to transfer the asperity pattern, or a photoresist film is formed on a magnetic recording layer, and a desired asperity pattern is formed on the photoresist film by photolithography technique. Then, ions are implanted in the magnetic recording layer via the formed recessed part, or the magnetic recording layer exposed on the surface of the recessed part is milled etching, thereby separating the magnetic recording layer.

For the patterned media, such as the discrete track medium or the bit pattern medium described above, in the case where asperities have been formed physically on the magnetic recording layer by milling, the resist film is removed, the recessed part is filled with non-magnetic substances, and thereafter planarization is performed. On the other hand, in the case where the pattern has been formed by ion implantation, the planarization is achieved only by removing the resist film. Therefore, for a method of manufacturing a patterned medium, patterning by ion implantation which has less steps and which provides higher smoothness of the base surface is attracting attention (for example, Patent Document 1).

PRIOR ART DOCUMENT

Patent Document

[Patent Document 1] Japanese Unexamined Patent Application Publication No. 2008-77788

SUMMARY OF THE INVENTION

According to the above patterning of the magnetic recording layer by ion implantation described in Patent Document 1, a desired amount of ions are implanted into a guard band region (non-recording part) that separates magnetic regions (magnetic recording parts) of the magnetic recording layer magnetically, but ion concentration distribution does not become even in a perpendicular direction (in a depth direction). It is thought that the ion concentration is highest at a certain depth of the guard band region, and the ion concentration is progressively decreasing with distance in perpendicular direction from the depth.

That is, due to the thickness in a depth direction of the magnetic recording layer, ion implantation with a consistently constant energy causes ion concentration distribution having a maximum value at a certain center depth (bias). This may deteriorate a property of magnetic separation between the guard band part (non-recording part) and the data part, since an effect of changing magnetism is insufficient at both ends of the ion concentration distribution where ion concentration is poor.

For example, if ion implantation is aimed toward a lower part of the magnetic recording layer, the ion concentration of an upper part of the magnetic recording layer becomes insufficient. Alternatively, if ion implantation is aimed toward the upper part of the magnetic recording layer, the ion concentration of the lower part of the magnetic recording layer becomes insufficient. Further, if ion implantation is aimed toward the center, the ion concentrations of a highest part and a lowest part become insufficient.

It has been found that this phenomenon closely relates to the film thickness of the magnetic recording layer and that in particular it is remarkable with a film thickness of the magnetic recording layer of 13 nm or more, especially 15 nm or more.

Occurrence of such a bias in the ion concentration distribution in a perpendicular direction reduces the effect of the guard band part (non-recording part) changing magnetisms of the magnetic recording layer, resulting in deterioration in property of magnetic separation from the data part.

In view of such a problem, an object of the present invention is to a method of manufacturing a magnetic recording medium and a magnetic recording medium, which can make the concentration distribution in a perpendicular direction of ions implanted in a magnetic recording layer of a perpendicular magnetic recording medium a suitable concentration distribution according to a layer to be implanted with ions.

In order to solve the above problem, a typical structure of a method of manufacturing a magnetic recording medium according to the present invention includes a magnetic recording layer forming step of forming a magnetic recording layer on a base, a resist layer forming step of forming a resist layer on the magnetic recording layer, a patterning step of processing the resist layer so as to vary the thickness of the resist layer partially so that a predetermined pattern having recessed parts and protruded parts is formed and an ion implanting step of implanting ions into a plurality of layers including the magnetic recording layer with the resist layer interposed, wherein, at the ion implanting step, a layer to be implanted with ions is determined by adjusting an energy amount to implant ions, and a total amount of ions to be implanted into each layer is determined by adjusting a time period for which the energy amount is held.

According to the above structure, a desired ion implantation ion amount (dose amount) can be implanted into a desired layer in the magnetic recording layer. Therefore, the concentration distribution in a perpendicular direction of ions implanted into the magnetic recording layer can be made a suitable concentration distribution according to a layer to be implanted with ions. This makes it possible to obtain a magnetic recording medium that is excellent in SNR.

For example, a case is considered where the magnetic recording layer includes a first magnetic recording layer and a second magnetic recording layer that serves as a main recording layer formed on the first recording layer and having an oxide content larger than the first magnetic recording layer. In this case, the dose amount (energy holding time) for the second magnetic recording layer may be smaller than that for the first magnetic recording layer. This is because, since the second magnetic recording layer has a larger oxygen content, magnetic grains in a granular structure are finer, and therefore, even if a small amount of ions are implanted, magnetic separation is easily achieved.

Before the above resist layer forming step, an auxiliary recording layer forming step of forming an auxiliary recording layer made of a thin film which is adjacent to the top or bottom of the magnetic recording layer and which is magnetically continuous in a planar direction may be included, and at the above ion implanting step, the energy amount to implant ions and the time period for which the energy amount is held are adjusted so that the auxiliary recording layer may also be implanted with ions.

According to the above structure, by increasing or decreasing the energy amount, ions can be implanted into the auxiliary recording layer regardless of whether the auxiliary recording layer is formed on the top or bottom of the magnetic recording layer. Therefore, the concentration distributions, in the perpendicular direction, of ions to be implanted into the magnetic recording layer and the auxiliary recording layer can be made suitable concentration distributions corresponding to a layer. This makes it possible to obtain a suitable concentration distribution according to a layer to be implanted with ions, even if the auxiliary recording layer is formed.

Further, it is preferred that, after the ion concentration is made unbiased and made constant or higher in a depth direction of the magnetic recording layer, the ion concentration of the auxiliary recording layer is made higher than that of the magnetic recording layer.

In comparison between the magnetic recording layer and the auxiliary recording layer, the auxiliary recording layer tends to be a noise source since it is closer to a magnetic head. Further, magnetic interaction between the magnetic recording part and the non-recording part is more difficult to break in the auxiliary recording layer which is magnetically continuous than in the magnetic recording layer having a granular structure. However, as described above, by making the ion concentration of the auxiliary recording layer higher than that of the magnetic recording layer, excessive ions are prevented from being implanted into the magnetic recording layer while the auxiliary recording layer is securely separated. This makes it possible to change magnetism evenly in the depth direction of the auxiliary recording layer and the magnetic recording layer, and as a result the magnetic separation between the recording part and the non-recording part can be well achieved.

At the above ion implanting step, ions of one or a plurality of chemicals selected from a group consisting of B, P, Si, F, C, In, Bi, Kr, Ar, Xe, W, As, Ge, Mo, Sn, $N_2$, and $O_2$ may be implanted.

At the above ion implanting step, the energy amount to implant ions may range from 1 to 50 keV. If the energy amount to implant ions is less than 1 keV, the magnetic recording parts in the magnetic recording layer cannot be magnetically separated, the magnetic recording medium cannot be constituted as a patterned medium such as a discrete track medium or a bit pattern medium. If more than 50 keV, demagnetization or amorphization of the magnetic recording layer is excessively promoted, and this results in reduction in read-write property, or demagnetization up to the magnetic recording part.

At the above ion implanting step, the total amount of ions to be implanted may range from $1.0 \times 10^{15}$ to $1.0 \times 10^{17}$ atoms/$cm^2$.

The above magnetic recording layer may contain one or a plurality of elements selected from a group consisting of Fe, Pt, Ru, Co, Cr, and Pd.

The above magnetic recording layer may be a ferromagnetic layer having a granular structure in which a grain boundary part made of a non-magnetic substance is formed between crystal particles grown into columns. In particular, in a case where the magnetic recording layer is a discrete track medium, the magnetic recording layer having a granular structure improves SNR.

At the above ion implanting step, ions may be implanted gradually in the order from a deep layer to a shallow layer while the energy amount to implant ions is adjusted so as to decrease gradually from a high value to a low value.

Another typical structure of the method of manufacturing a magnetic recording layer according to the present invention includes a magnetic recording layer forming step of forming a magnetic recording layer on a base, a resist layer forming step of forming a resist layer where an implantation amount of ions is adjusted according to the thickness of the resist layer and an ion implanting step of implanting ions into the magnetic recording layer with the resist layer interposed, wherein the ion implanting step is divided into plural times and performed with different energy amounts of ion implantation.

It is preferred that, at the ion implanting step performed plural times corresponding to divided stages thereof, a step of the divided steps of the ion implanting step may be performed with a less energy amount than an earlier step thereof.

A typical structure of a magnetic recording medium according to the present invention is a magnetic recording medium having at least a magnetic recording layer on a base, wherein an auxiliary recording layer is formed as an upper layer of the magnetic recording layer, a magnetic recording part that performs recording and reproducing and a non-recording part implanted with ions are formed in the magnetic recording layer and the auxiliary recording layer and the non-recording part of the auxiliary recording layer has a higher ion concentration than the non-recording part of the magnetic recording layer.

The total film thickness of the magnetic recording layer and the auxiliary recording layer may be 13 nm or more.

As described above, the concentration distribution in a perpendicular direction of ions to be implanted into the magnetic recording layer can be made a suitable concentration distribution according to a layer to be implanted with ions.

BRIEF DESCRIPTION OF THE DRAWINGS

FIGS. 4(a) to 4(c) are diagrams for illustrating conditions of ion implantation performed in Example 1;

FIGS. 5(a) and 5(b) are graphs showing magnetization curves (hysteresis curves) of Example 1;

BEST MODES FOR CARRYING OUT THE INVENTION

Figure 1:
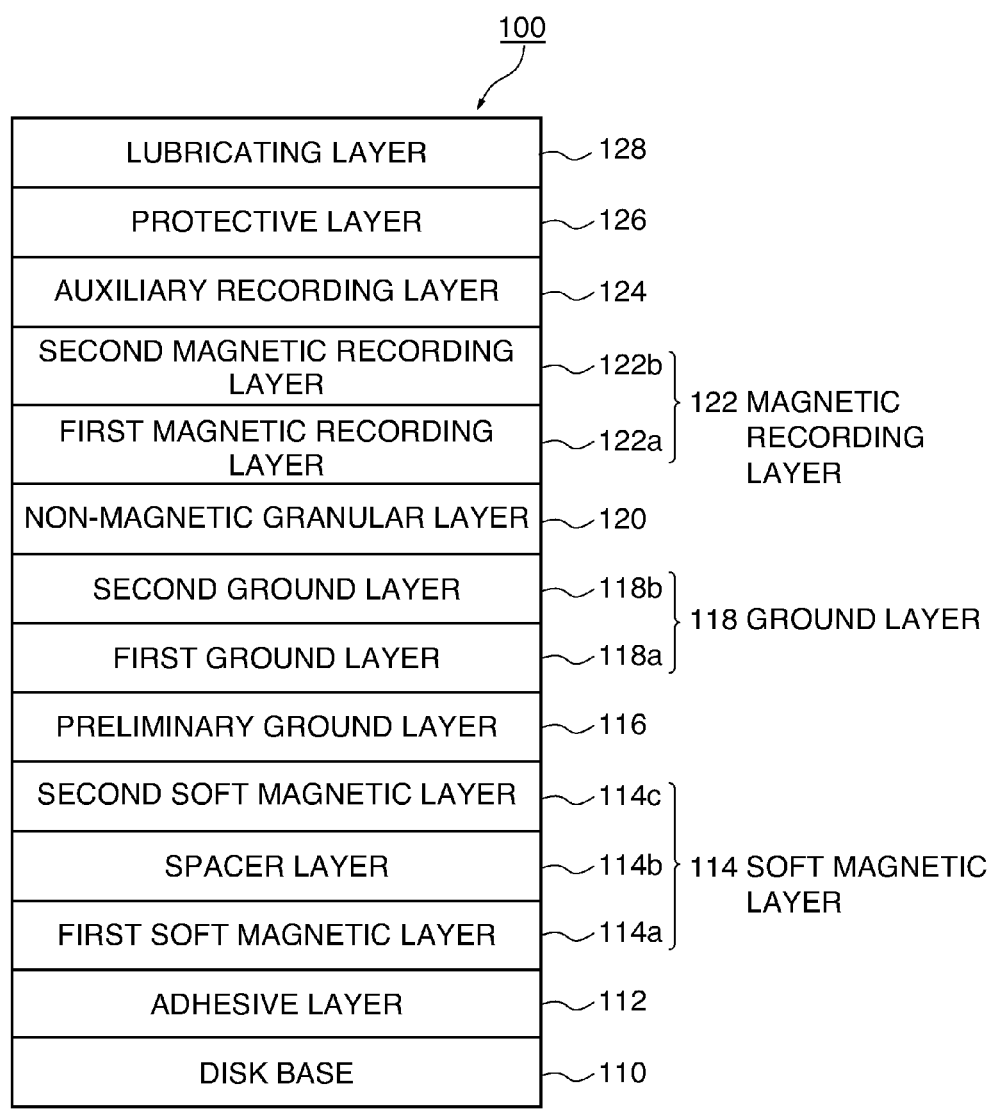
FIG. 1 is a diagram for describing a structure of a perpendicular magnetic recording medium according to an embodiment.

In the following, with reference to the attached drawings, preferred embodiments of the present invention will be described in detail. Dimensions, materials, and other specific numerical values shown in these embodiments are merely examples to facilitate understanding of the invention, and are not meant to restrict the present invention unless otherwise specified. Note that, in this specification and drawings, components having substantially the same functions and structures are provided with the same reference characters and are not redundantly described, and components not directly relating to the present invention are not shown in the drawings.
(Embodiment)

An embodiment of a method of manufacturing a magnetic recording medium according to the present invention will be described. FIG. 1 is a diagram for describing the structure of a discrete track-type perpendicular magnetic recording medium 100 (hereinafter, simply referred to as a perpendicular magnetic recording medium 100) as a magnetic recording medium according to this embodiment. The perpendicular magnetic recording medium 100 depicted in FIG. 1 includes a disk base 110 serving as a base, an adhesive layer 112, a first soft magnetic layer 114a, a spacer layer 114b, a second soft magnetic layer 114c, a preliminary ground layer 116, a first ground layer 118a, a second ground layer 118b, a non-magnetic granular layer 120, a magnetic recording layer 122, an auxiliary recording layer 124, a protective layer 126, and a lubricating layer 128. Note that the first soft magnetic layer 114a, the spacer layer 114b, and the second soft magnetic layer 114c together form a soft magnetic layer 114. The first ground layer 118a and the second ground layer 118b together form a ground layer 118.

[Base Molding Step]

As the disk base 110, a glass disk molded in a disk shape by direct-pressing amorphous aluminosilicate glass can be used. Note that the kind, size, thickness, and others of the glass disk are not particularly restricted. A material of the glass disk can be, for example, aluminosilicate glass, soda lime glass, soda aluminosilicate glass, aluminoborosilicate glass, borosilicate glass, quartz glass, chain silicate glass, or glass ceramic, such as crystallized glass. This glass disk is sequentially subjected to grinding, polishing, and chemical strengthening, thereby allowing a smooth non-magnetic disk base 110 made of a chemically-strengthened glass disk to be obtained.

[Film Forming Step]

On the disk base 110 obtained at the base molding step described above, the adhesive layer 112, the soft magnetic layer 114, the preliminary ground layer 116, the ground layer 118, the non-magnetic granular layer 120, the magnetic recording layer 122 (magnetic recording layer forming step), and the auxiliary recording layer 124 (auxiliary recording layer forming step) can be sequentially formed by DC magnetron sputtering, and the protective layer 126 can be formed by CVD. Note that it is also preferred that an in-line-type film forming method be used in view of high productivity. In the following, the structure of each layer, and a magnetic pattern forming step including a resist layer forming step, a patterning step, an ion implanting step, and a removing step, which is a feature of this embodiment, will be described.

The adhesive layer 112 is amorphous, formed in contact with the disk base 110, and provided with a function of increasing delamination strength between the soft magnetic layer 114 formed thereon and the disk base 110. If the disk base 110 is made of amorphous glass, it is preferred that the adhesive layer 112 be an amorphous alloy film so as to be adapted to the amorphous glass surface. As the adhesive layer 112, for example, a CrTi amorphous layer can be selected.

The soft magnetic layer 114 is a layer on which a magnetic path is temporarily formed at a recording time for causing magnetic flux to pass in a direction perpendicular to a recording layer in a perpendicular magnetic recording system. The soft magnetic layer 114 can be configured to include AFC (antiferro-magnetic exchange coupling) by interposing the non-magnetic spacer layer 114b between the first soft magnetic layer 114a and the second soft magnetic layer 114c. This makes it possible to align the direction of magnetization of the soft magnetic layer 114a along the magnetic path (magnetic circuit) with high precision, and perpendicular components in the direction of magnetization are extremely reduced, and therefore noise generated from the soft magnetic layer 114 can be reduced. As the composition of the first soft magnetic layer 114a and the second soft magnetic layer 114c, a cobalt-type alloy, such as CoTaZr, an Fe—Co-type alloy, such as FeCoTaZr or FeCoCrB, an Ni—Fe-type alloy, such as an [Ni—Fe/Sn]n multilayer structure, or others can be used.

The preliminary ground layer 116 is a non-magnetic alloy layer, and provided with an effect of protecting the soft magnetic layer 114 and a function of orienting an easy axis of magnetization of a hexagonal close-packed structure (hcp structure) included in the ground layer 118 formed thereon in a direction perpendicular of the disk. It is preferred that the preliminary ground layer 116 have a (111) face of a face-centered cubic structure (fcc structure) parallel to a main surface of the disk base 110. As a material of the preliminary ground layer, Ni, Cu, Pt, Pd, Zr, Hf, or Nb can be selected. Further, it may be an alloy containing these metals as a main component and one or more additive elements, Ti, V, Ta, Cr, Mo, and W. For example, as a preferred fcc structure, NiW, CuW, or CuCr can be selected.

The ground layer 118 has an hcp structure, and has a function of growing a Co crystal in an hcp structure of the magnetic recording layer 122 as a granular structure. Therefore, the higher the crystal orientation of the ground layer 118 is, that is, the more parallel a (0001) face of a crystal of the ground layer 118 is to a main surface of the disk base 110, the more improved the orientation of the magnetic recording layer 122 can be. Though Ru is a typical material of the ground layer 118, RuCr or RuCo can also be selected. Since Ru has an hcp structure and a lattice space of the crystal similar to that of Co, the magnetic recording layer 122 having Co as a main component can be well-oriented.

When the ground layer 118 is made of Ru, it can be formed into a two-layer structure made of Ruby changing a gas pressure at a sputtering time. Specifically, the gas pressure of Ar is made higher when the second ground layer 118b on an upper layer side is formed than when the first ground layer 118a on a lower layer side is formed. When the gas pressure is made high, a free moving distance (a mean free path) of Ru ions to be sputtered is shortened, and therefore the film formation rate is delayed, thereby improving crystal separability. Further, with an increased pressure, the size of crystal lattice is decreased. Since the size of the crystal lattice of Ru is larger than that of the crystal lattice of Co, when the crystal lattice of Ru is made small, the crystal lattice of Ru becomes closer to that of Co, which can result in further improvement of the crystal orientation of the granular layer of Co.

The non-magnetic granular layer 120 is a non-magnetic granular layer. Forming the non-magnetic granular layer on the hcp crystal structure of the ground layer 118 and growing a granular layer of the first magnetic recording layer 122a thereon have a function of separating the magnetic granular layer from a stage of initial growth (startup). The composition of the non-magnetic granular layer 120 can be configured in a columnar granular structure by forming a grain boundary between non-magnetic crystal particles made of Co-type alloy by segregation of non-magnetic substances. In particular, CoCr—$SiO_2$ or CoCrRu—$SiO_2$ can be suitably used, and further Rh (rhodium), Pd (palladium), Ag (silver), Os (osmium), Ir (iridium), or Au (gold) can also be utilized in place of Ru. Further, the non-magnetic substance is a substance in which a grain boundary part can be formed around magnetic particles so as to suppress or interrupt a function of exchange interaction between magnetic particles (magnetic grains), and may be any non-magnetic substance as long as it is not solid-soluble with cobalt (Co). Examples can include silicon oxide ($SiO_x$), chrome (Cr), chrome oxide ($CrO_2$), titanium oxide ($TiO_2$), zircon oxide ($ZrO_2$), and tantalum oxide ($Ta_2O_5$).

The magnetic recording layer 122 is a ferromagnetic layer having a columnar granular structure in which a grain boundary is formed around magnetic particles of a hard magnetic body selected from a Co-type alloy, an Fe-type alloy, or an Ni-type alloy by segregation of a non-magnetic substance. With provision of the non-magnetic granular layer 120, this magnetic particle can grow epitaxially continuing from the granular structure. In this embodiment, the magnetic recording layer 122 is composed of the first magnetic recording layer 122a and the second magnetic recording layer 122b that are different in composition and film thickness. For both of the first magnetic recording layer 122a and the second magnetic recording layer 122b, a oxide, such as $SiO_2$, $Cr_2O_3$, $TiO_2$, $B_2O_3$, or $Fe_2O_3$, a nitride, such as BN, or a carbide, such as $B_4C_3$ can be suitably used as a non-magnetic substance.

Since the perpendicular magnetic recording medium 100 according to this embodiment is of a discrete track-type, the structure that the magnetic recording layer 122 has the granular structure can improve SNR. Note that, when the perpendicular magnetic recording medium 100 is of a bit pattern-type, since each recording bit is separated and independent, the magnetic recording layer 122 does not necessarily have the granular structure.

The auxiliary recording layer 124 is a layer magnetically continuous in an in-plane direction on the magnetic recording layer 122 having the granular structure. Since the auxiliary recording layer 124 has a function of magnetic interaction (exchange coupling) with the magnetic recording layer 122, a magnetostatic property such as a coercive force Hc or an inverted-magnetic-domain nucleation magnetic field Hn can be adjusted, thereby attaining an object of improving resistance to thermal fluctuation, an overwrite (OW) characteristic, and an SNR. As a material of the auxiliary recording layer 124, a CoCrPt-type alloy can be used, and further an additive, such as B, Ta, or Cu, may be added. Specifically, CoCrPt, CoCrPtRu, CoCrPtRuB, CoCrPtB, CoCrPtTa, CoCrPtCu, CoCrPtCuB, or the like can be used. Further, the auxiliary recording layer 124 may contain such an amount of oxide as does not cause magnetic continuity to be lost (for example, 3 mol % or less). The film thickness of the auxiliary recording layer 124 can be set to, for example, 3 to 10 nm. Note that, when the perpendicular magnetic recording medium 100 is of a bit pattern-type and the magnetic recording layer 122 does not have a granular structure, the auxiliary recording layer 124 is not essential.

The protective layer 126 can be formed by forming a carbon film by CVD with a vacuum kept. The protective layer 126 is a protective layer to protect a perpendicular magnetic recording layer from an impact from the magnetic head. Since a carbon film formed by CVD is generally improved in film hardness as compared with that formed by sputtering, the perpendicular magnetic recording layer can be protected more effectively from the impact from the magnetic head.

<Magnetic Track Pattern Forming Step>

Next, a magnetic pattern forming step of forming magnetic recording parts as recording regions separated magnetically and a non-recording part provided between the magnetic recording parts to separate the magnetic recording potions magnetically will be described in detail. Here, though the magnetic pattern forming step may be performed immediately after the above magnetic recording layer forming step, it may also be performed after the auxiliary recording layer forming step and the protective layer forming step.

The magnetic pattern forming step in this embodiment is performed after the protective layer forming step is performed. This eliminates the need to form the protective layer after the magnetic pattern forming step is performed, the manufacturing step becomes simple, and therefore improvement in productivity and reduction in contamination in the manufacturing process of the perpendicular magnetic recording medium 100 can be achieved.

FIGS. 2(a) to 2(d) are explanatory diagrams for describing the magnetic pattern forming step according to this embodiment. Note that, in FIGS. 2(a) to 2(d), the layers on the disk base 110 side from the magnetic recording layer 122 are omitted for easy understanding. The magnetic pattern forming step is configured to include a resist layer forming step, a patterning step, an ion implanting step, and removing step. The respective steps in the magnetic pattern forming step will be described below.

<Resist Layer Forming Step>

Figure 2A:
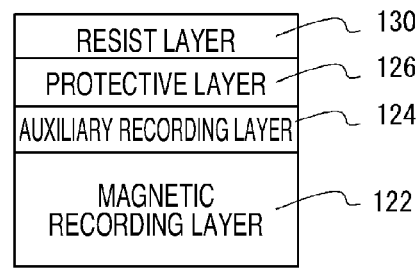
FIGS. 2(a) to 2(d) are explanatory diagrams for describing magnetic track pattern forming steps according to the embodiment.

As shown in FIG. 2(a), a resist layer 130 is formed on the protective layer 126 by spin coating. SOG (Spin On Glass)

using silica as a main component of the resist layer 130, a general novolac-type photoresist, or the like can be suitably utilized.

<Patterning Step>

Figure 2B:
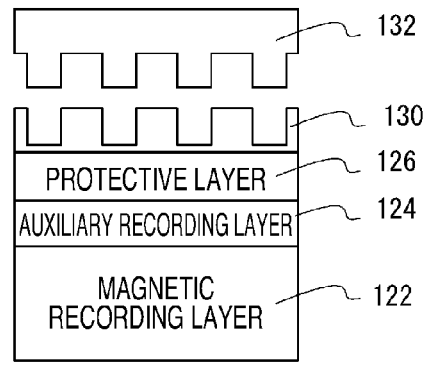

As shown in FIG. 2(b), a magnetic pattern is transferred onto the resist layer 130 by pressing a stamper 132 (an imprint method). The stamper 132 has an asperity pattern corresponding to respective patterns of a magnetic recording part and a non-recording part to be transferred. Note that, in addition to the protruded and recessed patterns of the magnetic recording part and the non-recording part, the stamper 132 can also have an asperity pattern of a servo region to store servo information, such as a preamble part, an address part, or a burst part.

After the magnetic pattern is transferred onto the resist layer 130 by the stamper 132, the stamper 132 is removed from the resist layer 130 so that the asperity pattern is formed on the resist pattern 130. Note that, in this embodiment, the surface of the stamper 132 is coated with a fluorine-type release agent. This makes it possible to release the stamper 132 from the resist layer 130 successfully.

Though at the patterning step in this embodiment an imprint method using the stamper 132 is utilized, photolithography can also be suitably utilized. When a photolithography method is utilized, at the resist layer forming step, a photoresist film is formed as a resist layer, and exposure and development are performed using the photoresist film formed as a mask, so that a predetermined pattern as a magnetic track part is transferred.

<Ion Implanting Step>

Figure 2C:
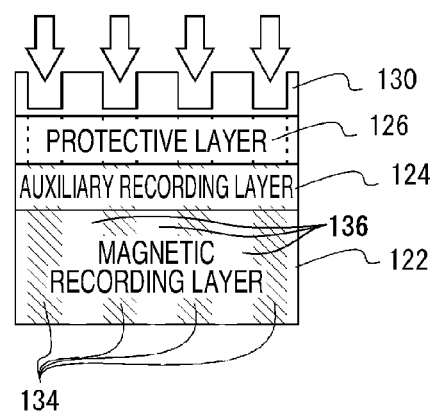

As shown in FIG. 2(c), ions are implanted into the magnetic recording layer 122 by an ion beam method via the protective layer 126 from a recessed part of the resist layer 130 patterned with a predetermined pattern at the patterning step. This can cause demagnetization (amorphization) of a crystal at an ion-implanted part in the magnetic recording layer 122 ion-implanted, thereby forming a non-magnetic part 134. Since ions are blocked at a projected part of the resist layer 130, a part below the projected part is magnetically separated to form a magnetic recording part 136.

Particularly, in this embodiment, ion implantation is performed in the following manner. That is, the layer (depth) to be ion-implanted is determined by adjusting the energy amount to implant ions, and the total amount (a dose amount) of ions to be implanted into respective layers is determined by adjusting a time for which the energy amount is held. In other words, a plurality of divided steps of the ion implanting step is performed with different energy amounts of ion implantation. Note that, since the condition that the amount of ions per unit time is constant is adopted, the dose amount is proportional to a time.

Therefore, it is possible to implant ions into only a part belonging to the magnetic recording layer 122 in the region 134 below the recessed part of the resist layer 130 (a region that serves as the non-recording part is shown by hatching in FIG. 2) as a target, and it is also possible to implant ions into only a part belonging to the auxiliary recording layer 124 therein as a target.

According to the above structure, by increasing or decreasing the energy amount, ions can be implanted into the auxiliary recording layer 124 regardless of whether the auxiliary recording layer 124 is formed above or below the magnetic recording layer 122. This makes it possible to set the concentration distribution in a perpendicular direction of ions implanted into the magnetic recording layer and the auxiliary recording layer to a suitable concentration distribution corresponding to a layer. That is, the auxiliary recording layer 124 can be changed in magnetization in the same manner as the magnetic recording layer 122 having the granular structure in which a grain boundary made of a non-magnetic substance has been segregated.

Though in this embodiment, ions of one or a plurality of chemicals of Ar, $N_2$, and $O_2$ are used as ions to be implanted, ions of one or a plurality of chemicals selected from a group consisting of B, P, Si, F, C, In, Bi, Kr, Ar, Xe, W, As, Ge, Mo, Sn, $N_2$, and $O_2$ may be implanted.

Further, the energy amount to implant ions ranges from 1 to 50 keV. When the energy amount to implant ions is less than 1 keV, magnetical separation of the magnetic recording parts 136 in the magnetic recording layer 122 is not properly performed, which causes noise when reading is performed by the head. When 50 keV or more, demagnetization or amorphization of the magnetic recording layer 122 is excessively promoted, which causes reduction in read-write characteristics, or causes demagnetization up to apart configuring the magnetic recording part 136 below the projected part of the resist layer 130.

Further, the total amount (the dose amount) of ions to be implanted ranges from $1.0 \times 10^{15}$ to $1.0 \times 10^{17}$ atoms/cm$^2$ (1E15 to 1E17 atoms/cm$^2$). This makes it possible to magnetically separate the magnetic recording parts successfully.

Further, in this embodiment, demagnetization by ion implantation means a treatment having the tendency of attenuating magnetization. Therefore, how many ions should be implanted does not matter, as long as the magnetic recording parts 136 can be magnetically separated by ion implantation. Being magnetically separated means being able to performing magnetization reversal individually. Specifically, so-called semi-hardening may also be performed by implanting ions such that the relative permeability ranges from 2 to 100. This makes it possible to elevate the degree of freedom of ion implantation conditions to increase mass productivity, and also makes it possible to suppress bleeding from an ion-implanted region because the effect can be obtained by a relatively small amount of ions. This facilitates increasing the track density.

<Removing Step>

Figure 2D:
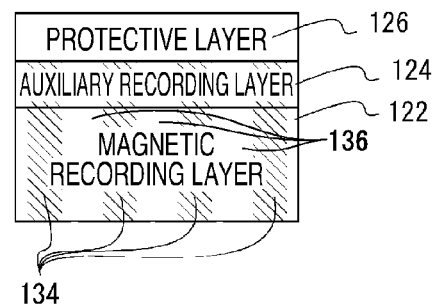

As depicted in FIG. 2(d), the resist layer 130 is removed with RIE (Reactive Ion Etching) using fluorine gas. In this embodiment, $SF_6$ is used for etching gas, but it is not limited to this, and either one selected from a group consisting of $CF_4$, $CHF_3$, and $C_2F_6$, or a mixed gas of these can also be suitably utilized.

In this embodiment, since SOG is used as the resist layer 130, etching is performing by using fluorine-type gas, but it is obvious that the kind of gas can be changed according to the material of the resist layer 130. For example, when a novolac-type photoresist is used as the resist layer 130, RIE using oxygen gas is preferred.

In this embodiment, as a plasma source of RIE, ICP (Inductively Coupled Plasma) capable of generating high-density plasma at a low pressure is utilized, but it is not limited to this, and ECR (Electron Cyclotron Resonance) plasma or a general parallel-flat-type RIE apparatus can also be utilized.

(Lubricating Layer Forming Step)

The lubricating layer 128 can be formed with PFPE (perfluoropolyether) by dip coating. PFPE has a long-chain molecular structure, and is bonded to N atoms on the surface of the protective layer 126 with high affinity. Owing to this function of the lubricating layer 128, damage and loss of the protective layer 126 can be prevented, even if the magnetic head contacts with the surface of the perpendicular magnetic recording medium 100.

(Examples and Evaluations)

Films of the adhesive layer 112 to the auxiliary recording layer 124 were sequentially formed on the disk base 110 in an Ar atmosphere by DC magnetron sputtering with use of a vacuumed film forming device. As for the adhesive layer 112, a film of 50Cr-50Ti of 10 nm (the unit is at % in principle. This also applies to the following) was formed. As for the soft magnetic layer 114, the compositions of the first soft magnetic layer 114a and the second soft magnetic layer 114c were 28Co-8Cr-52Fe-12B and the film thicknesses thereof were 20 nm, respectively, and the composition of the spacer layer 114b was Ru and the film thickness thereof was 0.7 nm. The composition of the preliminary ground layer 116 was alloy of 92Ni-8W having an fcc structure and the film thickness thereof was 7 nm. As for the ground layer 118, a film of Ru of 10 nm was formed under a low-pressure Ar atmosphere for the first ground layer 118a, and a film of Ru of 10 nm was formed under high-pressure Ar atmosphere for the second ground layer 118b. The composition of the non-magnetic granular layer 120 was non-magnetic 90(Co-50Cr)-10($SiO_2$) and the film thickness thereof was 1 nm. The magnetic recording layer 122 was formed from a CoCrPt-oxide containing at least Pt and oxide. Specifically, the first magnetic recording layer 122a was a film of 90(Co-10Cr-18Pt)-5($SiO_2$)-5($TiO_2$) of 6 nm, and the second magnetic recording layer 122b was a film of 90(Co-10Cr-18Pt)-5($SiO_2$)-5($TiO_2$) of 6 nm. The composition of the auxiliary recording layer 124 was Co-18Cr-15Pt-5B and the film thickness thereof was 6 nm. The protective layer 126 was formed by CVD using $C_2H_4$, and thereafter the surface was subjected to nitriding, and the film thickness was 5 nm.

Figure 3:
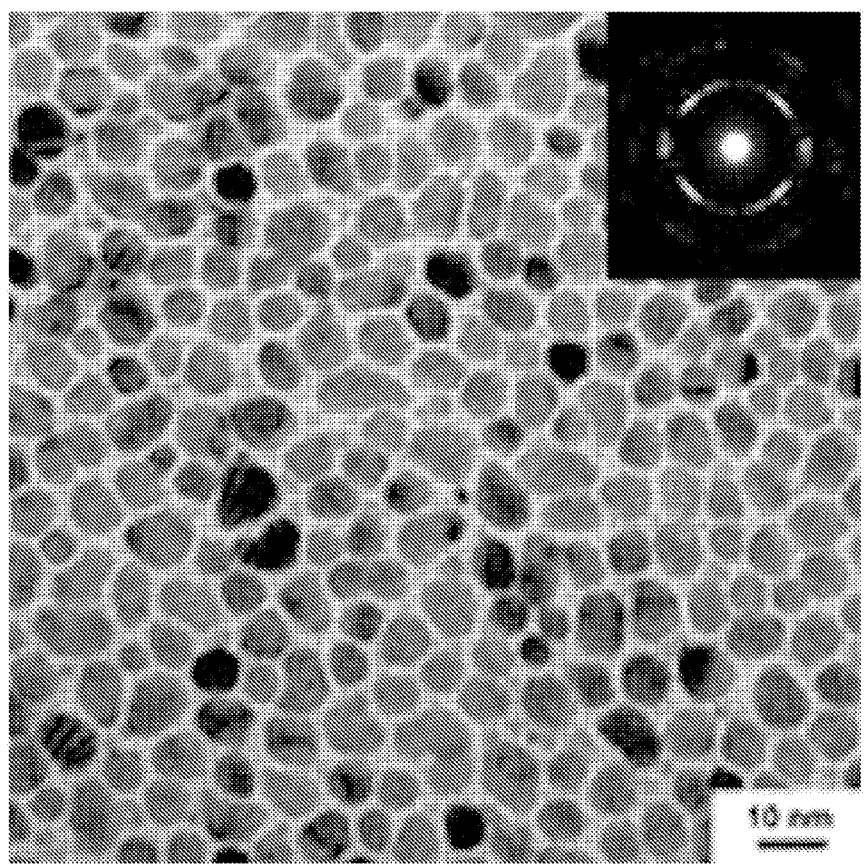
FIG. 3 is a view showing a planar TEM image of a magnetic recording layer of Example 1.

FIG. 3 is a view showing a planar TEM image of the magnetic recording layer of Example 1. Planar TEM images regarding the first magnetic recording layer and the second magnetic recording layer of this sample were obtained, and their area ratios of magnetic particles to grain boundaries in the granular structures were both 3:1. That is, the area of magnetic particles occupies 75%.

Thereafter, a film of SOG of 50 nm containing silica as a main component was formed on the surface of the protective layer 126 as the resist layer 130 by spin coating method. Further, a magnetic pattern was transferred onto the resist layer 130 by pressing the stamper 132 by an imprint method.

After the magnetic pattern was transferred onto the resist layer 130 by the stamper 132, the stamper 132 was removed from the resist layer 130, so that an asperity pattern having a residual thickness of a recessed part of 20 nm, a residual thickness of a projected part of 80 nm, a track part of 60 nm, and a track pitch of 120 nm (a track part of 60 nm, a guard band part of 60 nm) was transferred on the resist layer 130.

Simultaneously, for a magnetic property examination of the non-magnetic part (an ion-implanted region), a sample including the resist layer 130 with an overall film thickness of 20 nm and irradiated with ions was produced.

Further, from the recessed part of the resist layer 130 patterned into a predetermined pattern, ions were implanted into the magnetic recording layer 122 via the protective layer 126 by an ion beam method. At this time, $N_2$ ions were used as ions to be implanted, and ion implantation was performed with a dose amount of $2\times10^{16}$ atoms/cm$^2$ kept constant and with energy and a time changed in the following manner. Note that, since the condition that the amount of ions per unit time was constant was adopted, the dose amount was proportional to a time.

The resist layer 130 was removed by RIE using $SF_6$. The lubricating layer 128 was formed from PFPE by a dip coating method.

FIGS. 4(a) to 4(c) are diagrams for illustrating the conditions of ion implantation performed in the Examples of the present invention and in Comparative Examples. FIG. 4(a) is a graph showing variation in energy amount to implant ions at an ion implantation time along a time axis. Here, the value of energy amount is an N-atomic ion equivalent. Further, FIGS. 4(b) and 4(c) are diagrams schematically showing the distributions of ion concentration in the magnetic recording layer 122 that are obtained in this Example and the Comparative Examples.

EXAMPLE 1

In Example 1, the energy amount to implant ions was changed in stages (for each film), and the time period for which each energy amount was hold was changed. As shown by a solid line in FIG. 4(a), ion implantation was performed with 13 keV for five seconds, 10 keV for five seconds, and 7 keV for five seconds, for 15 seconds in total so as to reach a dose amount (a total ion amount) of $2\times10^{16}$ (atoms/cm$^2$). The SNR in the example 1 was 18.0 dB.

COMPARATIVE EXAMPLES 1 to 3

Comparative Examples 1 to 3 to be compared with Example 1 were prepared. As shown in FIG. 4(a), in the comparative example 1, ion implantation was performed for 15 seconds with a constant energy amount of 13 keV. In Comparative Example 2, ion implantation was performed for 15 seconds with an energy amount of 10 keV. In Comparative Example 3, ion implantation was performed for 15 seconds with an energy amount of 7 keV. In each case, setting was performed such that the dose amount (the total ion amount) was $2\times10^{16}$ (atoms/cm$^2$). As a representative of Comparative Examples, the SNR of the Comparative Example 2 was 16 dB.

By changing the energy amount to implant ions in this manner, arrival depth of ion implantation varies. In the case of medium structures of Example and Comparative Examples, by setting the ion implantation energy to 13 keV, 10 keV, and 7 keV, ions can be implanted at the respective centers of the first magnetic recording layer, the second magnetic recording layer, and the auxiliary recording layer. Note that, in Example 1, ion implantation was performed in the deeper order of the depth, namely, in the sequence from a deeper layer from the surface toward a shallower layer in the order of the first magnetic recording layer (for five seconds with 13 keV), the second magnetic recording layer (for five seconds with 10 keV), and the auxiliary recording layer (for five seconds with 7 keV).

In this manner, by giving an equal dose amount to not only the second magnetic recording layer 122b positioned in the middle of the magnetic recording layer 122 but also the first magnetic recording layer 122a and the auxiliary recording layer 124, the ion concentration distribution (variation) in a depth direction of the magnetic recording layer can be made small, and therefore magnetical separation can reliably be achieved.

Note that, in this Example, the energy amount of ion implantation was changed only in three stages, but it may be changed in any number of stages.

As shown in FIG. 4(b), in this Example, the respective ion concentrations of the auxiliary recording layer, the first magnetic recording layer, and the second magnetic recording layer were approximately equal. On the other hand, as shown by broken lines in FIG. 4(a), in Comparative Examples 1 to 3, implantation was performed for 15 seconds so as to reach a dose amount of $2\times10^{16}$ with ion implantation energies of 13 keV, 10 keV, and 7 keV, respectively.

As a result, in Comparative Examples, as shown in FIG. 4(c) of Comparative Example 2 as a representative, the ion concentration of the second magnetic recording layer 122b becomes high, but the ion concentrations of the first magnetic recording layer 122a and the auxiliary recording layer 124 become low. That is, bias occurs in the ion concentration distribution in a perpendicular direction. Such occurrence of bias reduces the effect of changing magnetism of the magnetic recording layer in the non-recording part 134, which results in deterioration in magnetical separation from the magnetic recording part 136. Though FIG. 4(b) shows only Comparative Example 2, the same holds true for Comparative Examples 1 and 3.

Compared with Comparative Example in FIG. 4(c), Example 1 in FIG. 4(b) has a suitable concentration distribution corresponding to a layer to be implanted with ions, and it is thought that the magnetic recording part 136 and the non-recording part 134 were able to be distinctly magnetically separated. This can be verified by the following comparison.

FIGS. 5(a) and 5(b) are graphs illustrating magnetization curves (hysteresis curves) of ion-implanted regions of samples (see paragraph 65) having a sufficiently large ion-implanted region produced simultaneously with the samples of Example and Comparative Examples. FIG. 5(a) shows a magnetization curve of Example 1 that was obtained by irradiation with the ion implantation energy amount changed in three stages. FIG. 5(b) illustrates the magnetization curves of the above Comparative Examples 1 to 3. In FIGS. 5(a) and 5(b), the horizontal axis indicates an external magnetic field (Field), and the vertical axis indicates Kerr rotation angle (Kerr rotation) obtained from a Polar Kerr effect measuring equipment. The Kerr rotation angle is a value corresponding to magnetization, and in FIGS. 5(a) and 5(b), normalization is performed such that a saturation value is 1.

The ion implantation energies called "high energy", "intermediate energy", and "low energy" of Comparative Examples 1 to 3 in FIG. 5(b) are 13 keV, 10 keV, and 7 keV, respectively.

Figure 6:
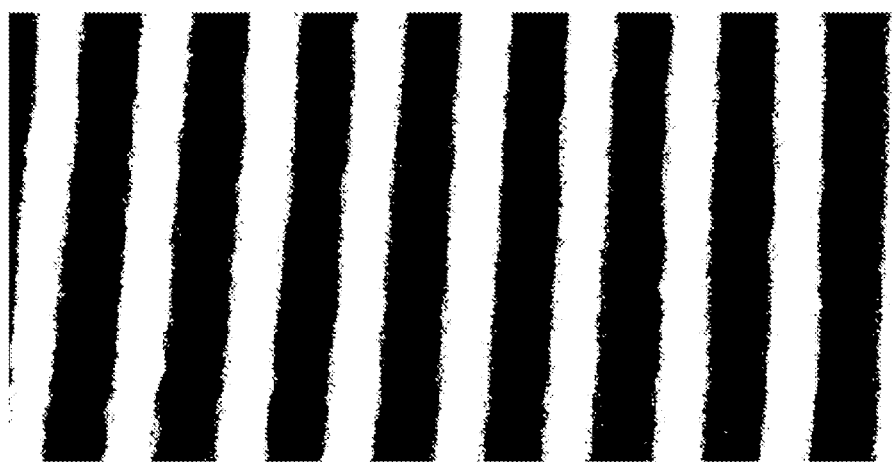
FIG. 6 is an MFM image of Example.

The magnetization curve of Example 1 in FIG. 5(a) has a smaller intersection with the horizontal axis showing an external magnetic field, that is, a smaller coercive force Hc, a smaller inclination of the magnetization curve (the magnetization curve is lying), a smaller remanent magnetization at zero magnetic field than those in the respective Comparative Examples in FIG. 5(b). This means that the magnetic property of the magnetic recording layer that was ferromagnetic originally could be weakened to be changed into a semi-hard magnetism. FIG. 6 is an MFM image of Example. When the magnetic pattern of the discrete track medium of Example 1 was examined by MFM for confirmation, it was found that an intended pattern with the magnetic recording part 136 (track part) of 60 nm and the non-recording part (guard band part) of 60 nm was obtained.

In FIG. 5(b), the Comparative Example 1 ion-implanted with high energy also obtained a small coercive force Hc equal to that of Example 1. However, each of the magnetization curves of Comparative Examples 1 to 3 has a sharper inclination than that of Example 1 and has a larger remanent magnetization at zero magnetic field. That is, this fact means that the magnetic recording layer has its original ferromagnetic property left.

OTHER EXAMPLES

In the above Example 1, giving equal dose amounts to the first magnetic recording layer 122a, the second magnetic recording layer 122b, and the auxiliary recording layer 124 has been described. However, at a plurality of divided steps of the ion implanting step performed, a step of the divided steps of the ion implanting step may be performed with a less energy amount than an earlier step thereof. This makes it possible to obtain the perpendicular magnetic recording medium 100 where the non-recording part 134 has an ion concentration on an upper side higher than that on a lower side. In particular, in such a case that the auxiliary recording layer 124 is provided like this embodiment, it is possible to obtain the perpendicular magnetic recording medium 100 where the non-recording part 134 of the auxiliary recording layer is higher in ion concentration than the non-recording part 134 of the magnetic recording layer 122.

Here, when the magnetic recording layer 122 and the auxiliary recording layer 124 are compared with each other, the auxiliary recording layer 124 requires a larger dose amount. This is because, since the auxiliary recording layer 124 is closer to the magnetic head and accordingly easily becomes a noise source, it is necessary to achieve separation securely. This is also because the magnetic recording part 136 and the non-recording part 134 cannot reliably be separated without a large difference between their magnetic properties, since magnetic interaction between the magnetic recording part 136 and the non-recording part 134 are less easily broken in the auxiliary recording layer 124 magnetically continuous than in the magnetic recording layer 122 having a granular structure.

Figure 7A:
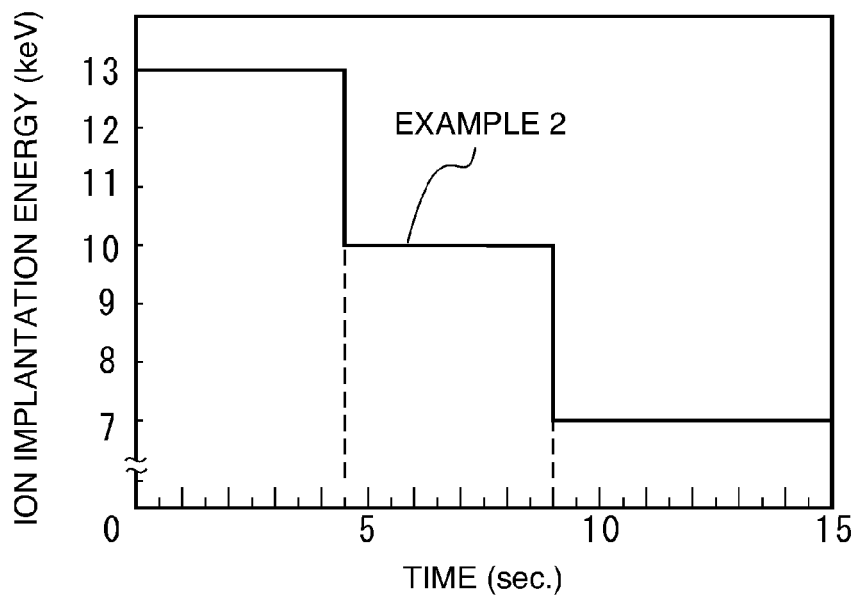
FIGS. 7(a) and 7(b) are diagrams for describing Examples 2 and 3.
Figure 7B:
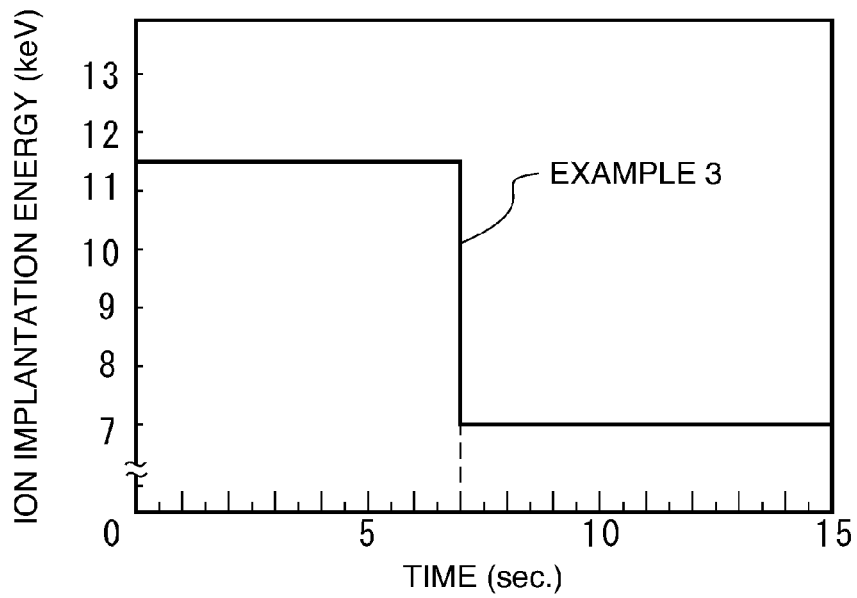

FIGS. 7(a) and 7(b) are diagrams for describing Examples 2 and 3. Example 2 shown in FIG. 7(a) had the same structure as the above Example 1 except for the time periods for which the respective energy amounts changed according to respective films were held. In Example 2, ion implantation was performed for 15 seconds in total with 13 keV for 4.5 seconds, 10 keV for 4.5 seconds, and 7 keV for 6 seconds so as to reach a dose amount (a total ion amount) of $2\times10^{16}$ (atoms/cm$^2$). Since the first magnetic recording layer 122a, the second magnetic recording layer 122b, and the auxiliary recording layer 124 had the same film thickness, the respective ion concentrations were 3:3:4. In other words, the ratio of the granular layer (the first magnetic recording layer 122a and the second magnetic recording layer 122b) and the auxiliary recording layer 124 was 3:4=75:100. The SNR of Example 2 was 18.5 dB. By implanting ions so as to make the ion concentration of the metal layer higher than that of the granular layer in this manner, a more successful result than that of Example 1 could be obtained.

Example 3 shown in FIG. 7(b) had the same structure as the above Example 1 except for the time period for which the respective energy amounts changed according to respective films were held. Here, an effective range in a depth direction in which ions can be implanted with one energy amount was about 13 nm. Therefore, in a case where a total film thickness of the magnetic recording layer 122 and the auxiliary recording layer 124 is 13 nm or more, magnetical separation can successfully be magnetically separated by performing ion implantation divided into twice. In Example 3, the first magnetic recording layer 122a and the second magnetic recording layer 122b that had granular structures were considered as a single layer, and the magnetic recording layer 122 and the auxiliary recording layer 124 were separately subjected to ion implantation. This makes it possible to obtain a suitable concentration distribution corresponding to a layer to be implanted with ions.

Specifically, ion implantation was performed for 15 seconds in total with 11.5 keV for 7 seconds and 7 keV for 8 seconds so as to reach a dose amount (total ion amount) of $2\times10^{16}$ (atoms/cm$^2$). The ion implantation with 11.5 keV aimed at implanting ions into an intermediate position between the first magnetic recording layer 122a and the second magnetic recording layer 122b. The SNR of Example 3 was 18.3 dB. By implanting ions so as to make the ion concentration of the metal layer higher than that of the granular layer in this manner, a more successful result than that of Example 1 could be obtained.

Figure 8A:
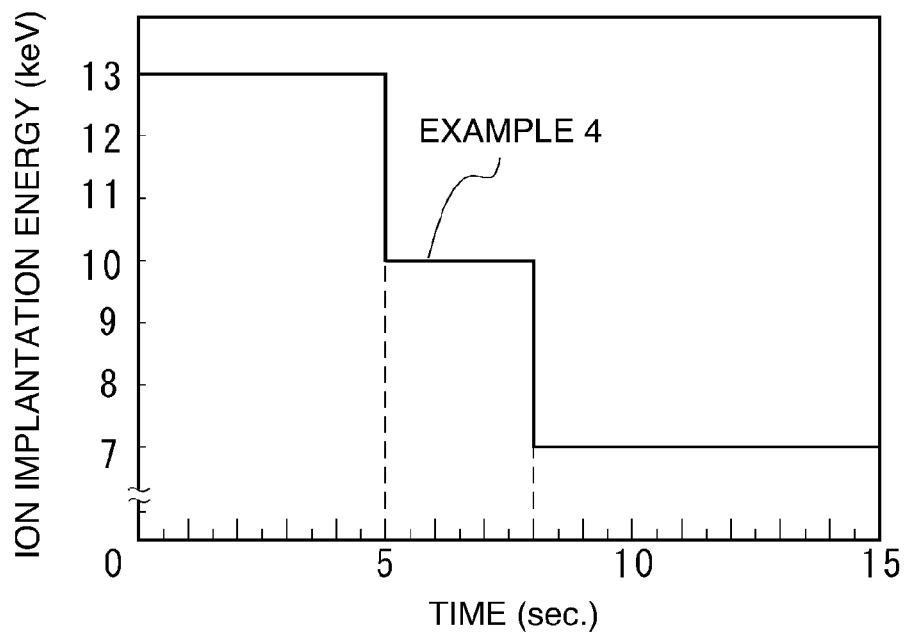
FIGS. 8(a) and 8(b) are diagrams for describing Example 4.
Figure 8B:
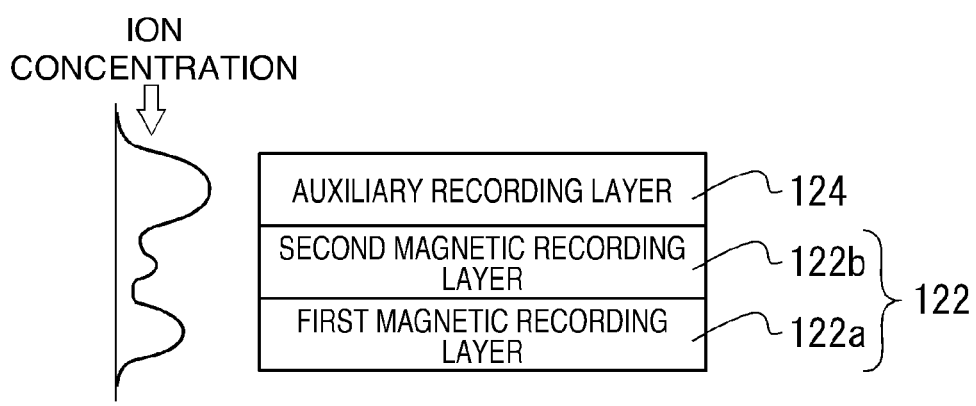

FIGS. 8(*a*) and 8(*b*) are diagrams for describing Example 4. As shown in FIG. 1, the magnetic recording layer 122 of the perpendicular magnetic recording medium 100 includes the first magnetic recording layer 122a and the second magnetic recording layer 122b. The second magnetic recording layer 122b is a main recording layer that is formed on the first magnetic recording layer 122a and that contains more oxides than the first magnetic recording layer 122a. In Example 4, as for the first magnetic recording layer 122a, a film of 92(Co-10Cr-18Pt)-4(SiO2)-4(TiO2) of 6 nm was formed, and as for the second magnetic recording layer 122b, a film of 90(Co-10Cr-18Pt)-5(SiO2)-5(TiO2) of 6 nm was formed. In this case, the dose amount (energy holding time) of the second magnetic recording layer 122b may be less than that of the first magnetic recording layer 122a. This is because, since the second magnetic recording layer 122b contains more oxides and therefore columnar crystal particles are narrower, magnetical separation can be achieved with less ions.

Further, in Example 4, the longest time period of ion implantation was allocated to the auxiliary recording layer 124, and the most ions were implanted into the auxiliary recording layer 124. This is because it is thought that the most ions are required for magnetical separation in the auxiliary recording layer 124 because the auxiliary recording layer 124 is a layer magnetically continuous in an in-plane direction and contains no oxygen.

The idea of Example 4 lies in that magnetical separation is performed in just proportion by changing the time periods of ion implantation according to the respective amounts of oxides in the first magnetic recording layer 122a, the second magnetic recording layer 122b, and the auxiliary recording layer 124 in which magnetical separations are to be performed to implant a necessary and sufficient amount of ions into each layer. This eliminates such a matter that a too-long ion implantation time period for the second magnetic recording layer 122b which can achieve magnetical separation with a small amount of ions causes demagnetization of even the adjacent magnetic recording part 136 that should keep magnetism, and thus the recording region becomes small, and a signal becomes weak. Further, such a matter is also eliminated that a too-short ion implantation time period for the auxiliary recording layer 124 which should be implanted with a large amount of ions to achieve magnetical separation causes imperfect magnetical separation, and thus data contains much noise. Therefore, in this Example, the SNR of a signal read out can be kept good.

As a specific example, in Example 4, as shown in FIG. 8(*a*), ion implantation was performed for 15 seconds in total with 13 keV for 5 seconds, 10 keV for 3 seconds, and 7 keV for 7 seconds so as to reach a dose amount (total ion amount) of $2\times10^{16}$ (atoms/cm$^2$). This makes it possible to obtain a suitable concentration distribution according to a layer to be implanted with ions, as shown in FIG. 8(*b*). The SNR of Example 4 was 18.7 dB. Since a more successful result than that of Example 1 could be obtained in this manner, it is thought that the magnetic recording part 136 and the non-recording part 134 can be magnetically separated further distinctively.

The preferred Examples of the present invention have been described above with reference to the appended drawings, but it goes without saying that the present invention is not limited to such Examples. It is obvious that a person skilled in the art can arrive at various modifications or alterations within the scope of claims, and those are of course understood as belonging to the technical scope of the present invention.

For example, in the above embodiment, ion implantation is performed without performing another treatment to the resist layer 130 on which the asperity pattern has been transferred, but it is not limited to this, and ion implantation may be performed after a resist layer remaining at the bottom of the recessed part of the resist layer 130 on which the asperity pattern has been transferred is removed by etching or the like.

Further, in the above embodiment, the ion implantation is performed, but the present invention is not limited to this, and a recessed part and a projected part are formed on the magnetic recording layer based on a predetermined pattern by etching the resist layer 130 on which the asperity pattern has been transferred, so that the structure of the recessed part of the magnetic recording layer can be adopted.

Further, for the embodiment described above, the discrete track-type magnetic recording medium has been described, but the present invention is not limited to this, and the present invention may be a bit patterned magnetic recording medium with a linearly-formed magnetic recording part formed further in an island shape. This makes it possible to improve the resistance to thermal fluctuation of the magnetic recording medium and thus promote increase in recording density.

Further, in the above embodiment, the magnetic recording layer is composed of two layers having granular structures, but it is not limited to this, and may be composed of a single layer or plural layers, and does not have to have a granular structure.

Further, in the embodiment described above, as the magnetic recording medium, a perpendicular magnetic recording medium has been described, but the present invention is also suitable for use in an in-plane magnetic recording medium.

INDUSTRIAL APPLICABILITY

The present invention can be applicable as a method of manufacturing a magnetic recording medium installed in an HDD of a magnetic recording type and as a magnetic recording medium.

DESCRIPTION OF REFERENCE NUMERALS

100: Perpendicular magnetic recording medium
110: Disk base
112: Adhesive layer
114: Soft magnetic layer
114a: First soft magnetic layer
114b: Spacer layer
114c: Second soft magnetic layer
116: Preliminary ground layer
118: Ground layer
118a: First ground layer
118b: Second ground layer
120: Non-magnetic granular layer
122: Magnetic recording layer
122a: First magnetic recording layer
122b: Second magnetic recording layer
124: Auxiliary recording layer
126: Protective layer
128: Lubricating layer
130: Resist layer 132: Stamper
134: Non-recording part
136: Magnetic recording part

The invention claimed is:

1. A method of manufacturing a magnetic recording medium comprising:
   a magnetic recording layer forming step of forming a magnetic recording layer, including first and second magnetic recording layers, on a base, the first and second magnetic recording layers differing in composition and film thickness,
   a resist layer forming step of forming a resist layer on the magnetic recording layer,
   a patterning step of processing the resist layer so as to vary a thickness of the resist layer such that at least a first part has a first thickness and a second part has a second thickness different from the first thickness, thereby forming a predetermined pattern having a recessed part and a projected part, and
   an ion implanting step of irradiating said resist layer with ions and implanting said ions into the first and second magnetic recording layers, wherein
   at the ion implanting step, (1) each of the first and second magnetic recording layers to be implanted with ions is determined by selectively applying an energy amount to implant ions, and (2) a total amount of ions to be implanted into each of said layers is determined by selectively applying said energy amount for a respective time period for said each of said layers,
   wherein the ion implanting step implants the ions into the first and second magnetic recording layers of the magnetic recording layer such that the first and second magnetic recording layers each separately have a distinct maximum ion concentration distribution at certain depth within each said layer.

2. The method of manufacturing a magnetic recording medium according to claim 1, further comprising, before the resist layer forming step:
   an auxiliary recording layer forming step of forming an auxiliary recording layer made of a thin film which is adjacent to the top or bottom of the magnetic recording layer and which is continuously magnetic in a planar direction, wherein
   at the ion implanting step, the auxiliary recording layer is also implanted with said ions by selectively applying the energy amount to implant said ions and selectively applying the energy amount for a respective time period such that the auxiliary recording layer is changed in magnetization in a same manner as the magnetic recording layer,
   wherein the auxiliary recording layer has a higher ion concentration than the magnetic recording layer.

3. The method of manufacturing a magnetic recording medium according to claim 1 or 2, wherein, at the ion implanting step, said ions are from a group consisting of one or a plurality of chemicals selected from a group consisting of B, P, Si, F, C, In, Bi, Kr, Ar, Xe, W, As, Ge, Mo, Sn, $N_2$, and $O_2$ are implanted.

4. The method of manufacturing a magnetic recording medium according to claim 1 or 2, wherein, at the ion implanting step, the energy amount to implant said ions ranges from 1 to 50 keV.

5. The method of manufacturing a magnetic recording medium according to claim 1 or 2, wherein, at the ion implanting step, the total amount of said ions to be implanted ranges from $1.0 \times 10^{15}$ to $1.0 \times 10^{17}$ atoms/cm$^2$.

6. The method of manufacturing a magnetic recording medium according to claim 1 or 2, wherein the magnetic recording layer is a ferromagnetic layer having a granular structure in which a grain boundary part made of a non-magnetic substance is formed between crystal particles grown into columns by the ion implanting step.

7. The method of manufacturing a magnetic recording medium according to claim 1 or 2, wherein, at the ion implanting step, said ions are implanted in the order from a deeper layer located first distance from said base to a shallower layer located a second distance from said base, where the first distance is shorter than said second distance, while the energy amount to implant ions is adjusted so as to decrease from a higher value to a lower value.

8. A method of manufacturing a magnetic recording medium comprising:
   a magnetic recording layer forming step of forming a magnetic recording layer, including first and second magnetic recording layers, on a base,
   a resist layer forming step of forming a resist layer by stamping, said resist layer having a thickness with a variable value to form a pattern, where an implantation amount of ions is determined according to the value of the thickness of the resist layer, and
   an ion implanting step of implanting ions into the magnetic recording layer, wherein
   divided steps of the ion implanting step are performed using different energy amounts for implanting said ions in different ones of said first and second magnetic recording layers,
   wherein the ion implanting step implants the ions into the first and second magnetic recording layers of the magnetic recording layer such that the first and second magnetic recording layers to each separately have a distinct maximum ion concentration distribution at a certain depth within each said layer.

9. The method of manufacturing a magnetic recording medium according to claim 1 or 2 or 8, wherein the ion implanting step is performed a plurality of times on said layers, at least once for each of said layers.

10. The method of manufacturing a magnetic recording medium according to claim 1 or 2 or 8, wherein the ion implanting step is performed a plurality of times on said layers, at plural times and at different energy levels for each of said layers.

* * * * *